(12) United States Patent
Jung et al.

(10) Patent No.: US 8,524,842 B2
(45) Date of Patent: Sep. 3, 2013

(54) SILICONE COMPOSITIONS CROSSLINKABLE INTO ADHESIVE GELS

(75) Inventors: Bernd Jung, Herrnburg (DE); Joerg Dienemann, Eutin (DE); Catherine George, Saint Genis les Ollieres (FR)

(73) Assignee: Bluestar Silicones France SAS, Lyons (FR)

( * ) Notice: Subject to any disclaimer, the term of this patent is extended or adjusted under 35 U.S.C. 154(b) by 848 days.

(21) Appl. No.: 10/560,906

(22) PCT Filed: Jun. 9, 2004

(86) PCT No.: PCT/FR2004/001424
§ 371 (c)(1),
(2), (4) Date: Jun. 7, 2007

(87) PCT Pub. No.: WO2005/003250
PCT Pub. Date: Jan. 13, 2005

(65) Prior Publication Data
US 2007/0270555 A1 Nov. 22, 2007

(30) Foreign Application Priority Data
Jun. 16, 2003 (FR) ...................................... 03 07210

(51) Int. Cl.
*C08L 83/04* (2006.01)
(52) U.S. Cl.
USPC ............. 525/477; 524/268; 525/478; 528/15; 528/31; 528/32

(58) Field of Classification Search
None
See application file for complete search history.

(56) References Cited

U.S. PATENT DOCUMENTS

| 4,374,967 | A | | 2/1983 | Brown et al. | |
|---|---|---|---|---|---|
| 4,709,001 | A | | 11/1987 | Maxson | |
| 4,783,289 | A | * | 11/1988 | Shimizu et al. | 264/28 |
| 4,990,560 | A | * | 2/1991 | Ikeno et al. | 524/731 |
| 5,216,104 | A | * | 6/1993 | Okami et al. | 528/15 |
| 5,679,734 | A | | 10/1997 | Peccoux et al. | |
| 5,998,516 | A | * | 12/1999 | Burkus et al. | 524/86 |
| 6,486,237 | B1 | | 11/2002 | Howe et al. | |
| 2003/0220448 | A1 | * | 11/2003 | Ozai et al. | 525/100 |

FOREIGN PATENT DOCUMENTS

| EP | 0 069 451 B1 | 1/1983 |
|---|---|---|
| EP | 0 273 704 B1 | 7/1988 |
| EP | 0 727 462 B1 | 8/1996 |
| EP | 0 737 721 B1 | 10/1996 |
| FR | 2 770 220 A1 | 4/1999 |

OTHER PUBLICATIONS

International Search Report corresponding to PCT/FR 2004/001424 issued on Oct. 20, 2005, 3 pages.

* cited by examiner

*Primary Examiner* — Marc Zimmer
(74) *Attorney, Agent, or Firm* — Dentons US LLP

(57) ABSTRACT

Gels having viscoelastic qualities, physical stability and adhesive properties, well suited for a wide variety of end applications, are prepared by crosslinking, by hydrosilylation, silicone compositions which contain:
- a polyorganosiloxanes POS (I) of SiH type;
- a polyorganosiloxanes POS (II) of SiVi type (Vi=vinyl);
- a polyorganosiloxanes POS (III) of monofunctional SiVi type;
- a platinum-based catalyst (D); and
- optionally, a polyorganosiloxanes POS (IV) of polydimethylsiloxane type.

17 Claims, No Drawings

SILICONE COMPOSITIONS CROSSLINKABLE INTO ADHESIVE GELS

CROSS-REFERENCE TO PRIORITY/PROVISIONAL APPLICATIONS

This application claims priority under 35 U.S.C. §119 of FR 03/07210, filed Jun. 16, 2003, and is the National Phase of PCT/FR 2004/000424, filed Jun. 9, 2004 and designating the United States, published on Jan. 13, 2005 as WO 2005/003250 A2, each hereby expressly incorporated by reference and each assigned to the assignee hereof.

The field of the present invention is that of compositions based on polyorganosiloxanes (POS) capable of crosslinking by addition or hydrosilylation reactions involving hydrogen substituents and ethylenically unsaturated radicals, that is to say alkenyls, in particular of the vinyl type. The hydrosilylation is generally catalyzed by metal compounds, for example of platinum nature.

The present invention relates more particularly to silicone compositions which can be crosslinked to give an adhesive gel by hydrosilylation at ambient temperature or by raising the temperature. Finally, the invention is targeted at the storable precursor systems of such silicone gels.

Within the meaning of the present invention, the term "silicone gel" denotes a crosslinked silicone product characterized by a degree of penetration of, for example, between 20 and 500 tenths of a mm (measured by ASTM D 2137 penetrometry, weight of the rod and of the cone: 62.5 g).

Silicone gels are conventionally obtained by crosslinking a composition comprising a polyorganosiloxane carrying at least two vinyl functional groups per molecule, a polyorganohydro-siloxane carrying at least two SiH functional groups per molecule, an unfunctionalized polyorganosiloxane and a platinum-based hydrosilylation catalyst. These semi-solid/semi-liquid silicone gels are conventionally used for the protection of electronic equipment sensitive to vibrations, to impacts, to temperature and more generally to physical and chemical attacks from the surrounding atmosphere. When used in this application, the silicone gels encapsulate electronic components (potting). Silicone gels are also used as base medical material, in particular for the preparation of prostheses, implants or dressings. They are also used as adhesive, as far as they possess significant adhesive properties, and as impact cushioning material.

For all these applications, the physical properties of these gels are adjusted according to the use by varying the levels of siloxyl units carrying Si-vinyl and SiH functional groups.

However, one of the major problems with silicone gels of this type is the maintenance of the physical properties, such as the viscoelasticity, over time, due in particular to the poor incorporation in the crosslinked matrix of the nonfunctionalized polyorganosiloxane, which, for this reason, can be readily extracted by leaching, resulting in a deterioration in the performance of the gel, such as, for example, the adhesion properties. It is for this reason that these gels are conventionally obtained from compositions comprising a high percentage by weight of nonfunctionalized polyorganosiloxane, of the order of 50% by weight with respect to the total weight of the constituents, in order to be able to optimize the viscoelastic properties, in particular for applications such as the manufacture of prostheses. Furthermore, adhesive properties are often desired for specific uses, such as, for example, in the medical or paramedical field with applications of dressings type.

European Patent Application No. 532 362 teaches silicone gel compositions comprising:

A—a polyorganosiloxane comprising from 90 to 97 mol % of units D=R(CH$_3$)SiO$_{2/2}$, 0.1 to 2.5 mol % of units T=RSiO$_{3/2}$ and 0.1 to 4 mol % of end units M=(CH$_3$R)SiO$_{1/2}$ with R=methyl, phenyl or CF$_3$CH$_2$CH$_2$—, and with the condition according to which these last two groups R represent 0.5 to 10 mol % of the total of the R groups;

B—a polyhydroorganosiloxane comprising at least one SiH per molecule and determining an SiH/SiVi ratio of between 0.5 and 1.5, and C—a platinum-based catalyst.

The search for self-adhesion for silicone gels was not the engine of the invention disclosed in this application. The hydrogenated POS B can be composed of a POS of the poly(dimethylsiloxy)α,ω(di-methylhydrosiloxy) type and optionally of a POS of the poly(dimethylsiloxy) (methylhydrosiloxy)α,ω(dimethyl-hydrosiloxy) type.

In this application, the only examples given are the mixtures, on the one hand, of substituted phenyl and α,ω-vinylated POSs and, on the other hand, of POSs hydrogenated in the chains and at the ends of the latter. The viscosity of the POSs A employed is of the order of 1000 mPa·s, whereas that of the POSs B used for the preparation of the gels is of the order of 100 mPa·s. The presence of T units (SiO$_{4/2}$, resin), presented as promoters of physical stability of the gels at low temperature, is one of the essential characteristics of this prior technical proposal. Finally, it should be emphasized that no reference whatsoever is made to the maintenance of the physical properties over time of the gel or of any adhesive properties of the gels under consideration.

In this state of knowledge, one of the essential objects of the present invention is to provide silicone compositions which can be crosslinked to give a gel by hydrosilylation, the said compositions having to result in silicone gels having at the very least the qualities expected in the products of the prior art, namely: cushioning, rapid rate of crosslinking and industrial reliability. These qualities, desired in the context of the invention, must in addition be better than those obtained to date. Finally, and in particular, the aim is to achieve silicone gels exhibiting improved adhesion (self-adhesion) properties, which are particularly desirable especially in the applications of the gels for medical and paramedical applications, such as dressings, to mention only them.

The Applicant Company has employed significant research means and has carried out numerous experiments to achieve this object, among others. At the end of this, it has had the credit of finding, entirely surprisingly and unexpectedly, that it is appropriate to introduce, into a standard composition capable of crosslinking to form a silicone gel, a monofunctional polyorganosiloxane carrying a single Si-alkenyl group per molecule.

Another object of the invention is to provide gels having physical properties which are stable over time, that is to say a gel not exhibiting a deterioration in its physical properties by leaching of the nonfunctionalized polyorganosiloxane.

Another incidental object of the invention is to provide a precursor silicone composition for an adhesive gel which is simple to prepare, which is economical, which is stable on storage and which is easy to use for the final user, who applies the composition immediately before it is converted into a gel in situ.

Another incidental object of the invention is to provide a precursor system for an adhesive silicone gel based on the composition of the type of that described above; the said system having to be a form which is stable on storage and which is easy to handle and to use for the preparation of the gel.

Another incidental object of the invention is to provide applications of the above composition and of the gel of which it may be the source, as means for encapsulating and protecting electronic units (potting, i.e. immersion or alternatively coating or sheathing), as medical materials of use, for example, in the manufacture of implants, of prostheses, of assembling cement, and the like, or alternatively in the manufacture of orthopaedic or paramedical articles (dressings), as leaktightness mastic and/or mortar, and, finally, as adhesive.

All these objects, among others, are achieved by the present invention, which relates to a silicone composition which can be crosslinked to give an adhesive gel by hydrosilylation, characterized in that it is composed essentially of:

(A)—at least one polyorganosiloxane POS (I) comprising:
a) end siloxyl units of type $M=(R)_2(H)SiO_{1/2}$ in which the R radicals, which are identical or different, correspond to an optionally substituted linear or branched $C_1$-$C_6$ alkyl group and/or a substituted or unsubstituted aryl group, and
b) identical or different siloxyl units of type $D=(R^1)_p(H)_q SiO_{2/2}$
in which the $R^1$ radicals correspond to the same definition as R and p=1 or 2, q=0 or 1 and p+q=2;
with the condition according to which the polyorganosiloxane POS (I) comprises at least two SiH radicals per molecule;

(B) at least one polyorganosiloxane POS (II) comprising:
a) end siloxyl units of type $M=(X)_s(R^2)_t SiO_{1/2}$ in which the $R^2$ radicals correspond to the same definition as R, the X radicals correspond to alkenyl groups having from 2 to 6 carbon atoms, preferably vinyl groups, s=0 or 1, t=2 or 3 and s+t=3; and
b) identical or different siloxyl units of type $D=(X)_u(R^3)_v SiO_{2/2}$
in which the $R^3$ radicals correspond to the same definition as R, the X radicals correspond to alkenyl groups having from 2 to 6 carbon atoms, preferably vinyl groups, u=0 or 1, v=1 or 2 and u+v=2,
with the condition according to which the polyorganosiloxane POS (II) comprises at least two X radicals per molecule;

(C)—at least one monofunctional polyorganosiloxane POS (III) which is essentially linear, having less than 2 mol % of unit $T=RSiO_{3/2}$, preferably less than 1.5 mol % and more preferably still less than 1 mol % of unit $T=RSiO_{3/2}$, and which comprises, per molecule, one alkenyl group (X) having from 2 to 6 carbon atoms directly bonded to a silicon atom, preferably one vinyl group directly bonded to a silicon atom, the said POS (III) comprising:
a) identical or different end siloxyl units of type $M=(X)_w(R^4)_x SiO_{1/2}$
in which the $R^4$ radicals correspond to the same definition as R, w=0 or 1, x=2 or 3 and w+x=3; and
b) at least one siloxyl unit $D=(X)_y(R^5)_z SiO_{2/2}$ in which the $R^5$ radicals correspond to the same definition as R, y=0 or 1, z=1 or 2 and y+z=2, (D)—an effective amount of at least one hydrosilylation reaction catalyst; and (E)—optionally at least one nonfunctionalized polyorganosiloxane POS (IV) comprising:
a) end siloxyl units of type $M=(R^6)_3 SiO_{1/2}$ in which the $R^6$ radicals correspond to the same definition as R, and
b) identical or different siloxyl units of type $D=(R^7)_2 SiO_{2/2}$ in which the $R^7$ radicals correspond to the same definition as R;

with the condition according to which the amount of the constituents (A), (B), (C) and (E) is chosen so that the molar ratio r of the hydrogen atoms bonded to silicon to the alkenyl radicals (X) bonded to silicon is between 0.2:1 and 5:1.

The use of the specifically selected POSs makes it possible to obtain silicone gels with improved properties, some of which will be set out below.

First of all, the rate of crosslinking of these gels is high, which meets the requirements of industrial profitability and reliability, in particular of the potting application of sensitive electronic components.

Furthermore, the viscoelastic properties of the gels prepared from the compositions according to the invention correspond well to the desired semi-solid/semi-liquid state. This state is capable of providing appropriate cushioning qualities which make possible perfect absorption of impacts and vibrations.

The gels obtained additionally have the advantage of being stable over time and at low temperature (down to −120° C.), that is to say that they maintain their physical properties without exhibiting a deterioration in their physical properties by leaching of the nonfunctionalized polyorganosiloxane.

It should be emphasized that these qualities are intrinsic to the compositions and to the gels according to the invention, notwithstanding the necessary absence of POSs comprising T units, which goes against the teaching of the prior art.

Finally, and in particular, one of the great advantages of the compositions of the invention is that they result in adhesive or self-adhesive silicone gels necessary for paramedical applications, such as, for example, dressings.

It is important to note that this increase in adhesion is not made at the expense of the other properties of the compositions and gels of the invention.

Preferably, the amount of the constituents (A), (B), (C) and (E) is chosen so that the molar ratio r of the hydrogen atoms bonded to silicon to the alkenyl radicals (X) bonded to silicon is between 0.5:1 and 1.5:1 and more preferably still equal to 1:1.

Preferably, the hydrosilylation reaction catalyst is based on platinum.

In practice, the most readily employed POSs (I) are polyorganosiloxanes of poly(dimethylsiloxy)-(siloxymethylhydro)-α,ω-(dimethylhydrosiloxy) type and α,ω-(dimethylhydrosiloxy)polydimethylsiloxanes. These POSs (I) are commercial products, such as, for example, the products from the range of the Rhodorsil® 626V, Rhodorsil® 620V and Rhodorsil® 628V products from Rhodia, and are widely disclosed in the technical literature, both as regards their structures and their syntheses.

Preferably, the POS (I) is substantially linear, that is to say that it comprises less than 2% of $RSiO_{3/2}$ units, and has a dynamic viscosity of less than or equal to 10 000 mPa·s, preferably of less than or equal to 6000 mPa·s, and more preferably still of between 5 and 5000 mPa·s.

According to another alternative form, the % by weight of reactive hydrogen groups bonded directly to a silicon atom is between 1 and 35%.

As regards the POS (II), the most readily employed are α,ω-(dimethylvinylsiloxy)polydimethyl-siloxanes or polyorganosiloxanes of poly(dimethylsiloxy)(methylvinylsiloxy) α,ω(dimethyl-vinylsiloxy) type.

These POSs (II) are commercial products, such as, for example, the products from the range of the Rhodorsil® 621V products from Rhodia, and are widely disclosed in the technical literature, both as regards their structures and their syntheses.

Preferably, the POS (II) is substantially linear, that is to say that it comprises less than 1% of $RSiO_{3/2}$ units, and has a dynamic viscosity of less than or equal to 200 000 mPa·s, preferably of less than or equal to 170 000 mPa·s and more preferably still of between 20 and 165 000 mPa·s.

According to another alternative form, the % by weight of reactive alkenyl groups bonded directly to a silicon atom is between 0.025% and 3%.

As regards the monofunctional POS (III), the alkenyl group directly bonded to a silicon atom is either at the chain end, carried by a siloxyl unit of M type, or pepdent, that is to say carried by a siloxyl, unit of D type. The most readily employed are monofunctional polyorganosiloxanes such as (dimethylvinylsiloxy)polydimethylsiloxanes or polyorganosiloxanes of poly(dimethylsiloxy)(methyl-vinylsiloxy)α, ω(trimethylsiloxy) type.

These POSs (III) are commercial products, such as, for example, the products from the Silopren® TP 3354 or Silopren® TP 3608 range of GE Bayer.

Preferably, the POS (III) has a dynamic viscosity of less than or equal to 150 000 mPa·s and preferably of between 20 and 100 000 mPa·s.

As regards the nonfunctionalized POS (IV), the most readily employed are α,ω-(trimethylsiloxy)-polydimethylsiloxane or PDMS oils. These POSs (IV) are commercial products, such as, for example, the products from the range of the Rhodorsil® 47V products (for example 47V20, 47V100, 47V500, 47V12500 or 47V30000) from Rhodia, and are widely disclosed in the technical literature, both as regards their structures and their syntheses.

Preferably, the POS (IV) is substantially linear and has a dynamic viscosity of less than or equal to 50 000 mPa·s, preferably between 20 and 40 000 mPa·s.

The catalyst (D) is another important component of the composition according to the invention. It is preferably an organometallic platinum complex or alternatively one of the platinum-based catalysts conventionally employed for the catalysis of hydrosilylation reactions between SiH groups and SiVi groups. Mention may be made, by way of examples, of platinum black, chloroplatinic acid, a chloroplatinic acid modified by an alcohol, or a complex of chloroplatinic acid with an olefin, an aldehyde, a vinylsiloxane or an acetylenic alcohol, inter alia. U.S. Pat. No. 2,823,218 discloses a hydrosilylation catalyst of the chloroplatinic acid type and U.S. Pat. No. 3,419,593 relates to catalysts formed by complexes of chloroplatinic acid and of organosilicone of the vinylsiloxane type. Complexes of platinum and of hydrocarbons of use as hydrosilylation catalyst are disclosed by U.S. Pat. Nos. 3,159,601 and 3,159,662. U.S. Pat. No. 3,723,497 discloses a platinum acetylacetonate and U.S. Pat. No. 3,220,972 has as subject-matter catalysts based on platinum alkoxide.

For the component (D), the term "effective amount of at least one hydrosilylation reaction catalyst" is understood to mean the amount sufficient to initiate the hydrosilylation reaction. As regards the catalytically effective amount to be employed, it is obvious that a person skilled in the art in the field under consideration is fully in a position to determine the optimum amount of catalyst to promote the hydrosilylation reaction. This amount depends in particular on the nature of the catalyst and the POSs involved. To give an idea, it may be indicated that it will be between 0.001 and 0.5% by weight with respect to the total weight of the composition.

To improve the stability on storage of the composition according to the invention and to provide the users with a commercial form which can be easily handled, a system with at least two components A and B comprising the constituents (A), (B) and (C) and optionally the constituent (E) of the silicone composition which can be crosslinked to give an adhesive gel by hydrosilylation as defined according to the invention is provided, with the condition that the hydrosilylation reaction catalyst (D) is separate from the constituent (B).

To simplify the use, it is preferable to provide a two-component system, the proportions A:B of which are between 10:100 and 100:10 and preferably between 40:60 and 60:40 and more preferably still 50:50 parts by weight approximately.

As regards the preparation of the gel, it may be specified that the crosslinking of the composition to give a gel takes place at ambient temperature or after heating at temperatures of between 50 and 200° C., for example. In this context, the crosslinking times necessary are, for example, between a few min and 1 hour 30 min. The crosslinked adhesive gel obtained from the composition described above forms a subject-matter in its own right of the present invention.

As regards the applications, the composition and the gel according to the invention can be used as means for cushioning from impact and protecting electronic components or the like (potting). The composition and/or the gel can thus be poured into a container comprising sensitive electronic components mounted on any support, for example made of epoxy resin. It is in fact an immersion of the delicate components in the silicone composition.

The composition and the gel can also encapsulate sensitive electronic components by other means, for example by coating sheathing, for the purpose of protecting them.

In view of these particularly significant adhesive properties, the silicone gel according to the invention can also be advantageously used for the preparation of adhesives, of medical material, preferably the type of those used in forming implants, prostheses, cements or the like, of paramedical material, of leaktightness products, of mastics or of assembling products.

The present invention also relates, as novel products, to the adhesives, the medical and paramedical materials, such as, for example, dressings, the impact-cushioning and protecting means or the cements, mastics or leaktightness materials produced from this silicone gel.

In these applications, it is possible to make use of all or part of the advantageous properties of the gel and of the composition according to the invention: high rate of crosslinking, physical stability (viscoelasticity) at low temperature (down to −120° C.) and at high temperature, cushioning properties, isolating quality, in particular with respect to air and to water, in particular, and, finally and especially, adhesive properties.

As regards the applications, the composition and the gel according to the invention can be used as means for cushioning from impact and protecting electronic components or the like (potting). The composition and/or the gel can thus be poured into a container comprising sensitive electronic components mounted on any support, for example made of epoxy resin. It is in fact an immersion of the delicate components in the silicone composition.

The composition and the gel can also encapsulate sensitive electronic components by other means, e.g.: coating sheathing, and the like, for the purpose of protecting them. In view of these particularly significant adhesive properties, the silicone gel according to the invention can also be advantageously used for the preparation:

of adhesives, of medical material, preferably the type of those used in forming implants, prostheses, cements or the like;

of leaktightness products, of mastics, of sealing compositions, or of assembling products.

The invention thus also relates to the use of the crosslinked adhesive gel, of the system with at least two components (A1) and (B1) according to the invention or of the silicone composition which can be crosslinked to give an adhesive gel by hydrosilylation according to the invention in the field:

of adhesives, of coatings, of leaktightness mastics, of the encapsulation and protection of electronic units, of materials for the manufacture of implants and prostheses, of impact-cushioning and protecting means, of assembling cements, and of dressings.

The following nonlimiting examples show various possibilities of formulation of the compositions according to the invention and the characteristics and the properties of the silicone gels obtained by crosslinking the said compositions.

EXAMPLES

The compositions described are provided in the two-component form and crosslinking is carried out after mixing two parts, named A and B, in a 50/50 ratio.

1) The starting materials used in the compositions of parts A and B of this gel are described in the list below:

POS (I)=poly(dimethylsiloxy)(siloxymethylhydro)-α,ω-(dimethylhydrosiloxy) oil or the poly(dimethylsiloxy) α,ω(dimethylhydrosiloxy) oil with a viscosity of 10 mPa·s comprising approximately 5 to 10% by weight of SiH groups.

POS (II)=α,ω-(dimethylvinylsiloxy)polydimethyl-siloxane oil with a viscosity of 300 mPa·s comprising approximately 0.1% by weight of vinyl groups.

Monofunctional POS (III)=α,ω-(trimethylsiloxy)-(methylvinylsiloxy)polydimethylsiloxane oil with a viscosity of 300 mPa·s comprising between 0.5 and 0.13% by weight of vinyl groups and comprising less than 1 mol % of T siloxyl units.

POS (IV)=α,ω-(trimethylsiloxy)polydimethyl-siloxane oil with a viscosity of 300 mPa·s.

Catalyst (V)=organometallic platinum complex used as crosslinking catalyst; the concentrations of this catalyst are given as % by weight of Pt metal with a degree of oxidation=0 with respect to the total weight of the composition.

2) The concentrations of each of these constituents in parts A and B are described in Table 1:

TABLE 1

Composition of the compositions tested:

| Constituents | Composition Part A | Part B |
|---|---|---|
| | Concentration by weight (%) | |
| POS (I) [SiH] | — | 3 |
| POS (II) [SiVi] | 63 | 63 |
| POS (III) [mono-SiVi] | 25 | 24 |
| POS (IV) [PDMS] | 12 | 10 |
| Catalyst (D) | 0.01 | — |
| Viscosity (mPa·s) | 3500 | 3500 |
| SiH/SiVi ratio | 1:1 | 1:1 |

3) Methodology for producing the gels:

The gels are prepared by simple mixing of the constituents of the compositions in a stirred reactor placed at 25° C.

4) Physical and adhesive properties of the gel obtained:

TABLE 2

| Crosslinking | A + B | Comparative Rhodorsil ® RT Gel 8260 |
|---|---|---|
| Viscous modulus G", Pa | 1700 | 920 |
| Elastic modulus G', Pa | 800 | 630 |
| Penetration test (mm) | 170 | 180 |
| Adhesion test | very sticky | Sticky |

The viscoelastic properties G' and G" were measured on a Haake RS150 rheometer under the following conditions:

Temperature=120° C.

Frequency sweep=1 hertz.

The penetration test is carried out according to a test analogous to the DIN Standard ISO-2137 (weight of the cone and of the rod: 62.5 g).

The adhesion test consists of a qualitative comparison between the comparative gel (Rhodorsil® RT Gel 8260, sold by Rhodia) and the gel according to the invention.

The gel obtained exhibits good stability over time despite a percentage by weight of polydimethylsiloxane of the order of 10% in the composition (versus 50% for the standard compositions).

These results clearly show that the gel obtained from the composition exhibits good physical properties and good adhesiveness.

The invention claimed is:

1. A silicone composition comprising:

(A) at least one polyorganosiloxane POS (I) having:

a) endgroup siloxyl units of type $M=(R)_2(H)SiO_{1/2}$ in which the R radicals, which may be identical or different, are each an optionally substituted linear or branched $C_1$-$C_6$ alkyl radical and/or a substituted or unsubstituted aryl radical, and b) identical or different siloxyl units of type $D=(R^1)_p(H)_q SiO_{2/2}$ in which the $R^1$ radicals have the same definition as R and p=1 or 2, g=0 or 1 and p+g=2;

with the proviso that the polyorganosiloxane POS (I) comprises at least two SiH radicals per molecule;

(B) at least one polyorganosiloxane POS (II) having:

a) endgroup siloxyl units of type $M=(X)_s(R^2)_t SiO_{1/2}$ in which the $R^2$ radicals have the same definition as R, the X radicals are alkenyl radicals having from 2 to 6 carbon atoms, s=0 or 1, 1=2 or 3 and s+t=3; and b) identical or different siloxyl units of type $D=(X)_u$ $(R^3)_v SiO_{2/2}$ in which the $R^3$ radicals have the same definition as R, the X radicals are alkenyl radicals having from 2 to 6 carbon atoms, u=0 or 1, v=1 or 2 and u+v=2, with the proviso that the polyorganosiloxane POS (II) comprises at least two X radicals per molecule;

(C) at least one monofunctional polyorganosiloxane POS (III) which is essentially linear, having less than 2 mol % of siloxyl unit $T=RSiO_{3/2}$, and which comprises, per molecule, one alkenyl radical (X) having from 2 to 6 carbon atoms directly bonded to a silicon atom, the said POS (III) having:
  a) identical or different endgroup siloxyl units of type $M=(X)_w(R^4)_x SiO_{1/2}$ in which the $R^4$ radicals have the same definition as R, w=0, x=3; and
  b) at least one siloxyl unit $D=(X)_y(R^5)_z SiO_{2/2}$ in which the $R^5$ radicals have the same definition as R, y=1, z=1, (D) an effective amount of at least one hydrosilylation reaction catalyst; and (E) at least one nonfunctionalized polyorganosiloxane POS (IV) having:
  a) endgroup siloxyl units of type $M=(R^6)_3 SiO_{1/2}$ in which the $R^6$ radicals have the same definition as R, and
  b) identical or different siloxyl units of type $D=(R^7)_2 SiO_{2/2}$ in which the $R^7$ radicals have the same definition as R;

with the proviso that the amount of the constituents (A), (B), (C) and (E) is such that the molar ratio r of the hydrogen atoms bonded to silicon to the alkenyl radicals (X) bonded to silicon is 1:1;

wherein the composition is crosslinkable into a gel by hydrosilylation and said composition, upon crosslinking, has a viscous modulus, (G") and an elastic modulus (G') greater than a comparable composition lacking component (C), POS (III).

2. The silicone composition as defined by claim 1, in which the $R^1$, $R^2$, $R^3$, $R^4$, $R^5$, $R^6$, $R^7$ and $R^8$ radicals are methyl radicals.

3. The silicone composition as defined by claim 1, in which the hydrosilylation reaction catalyst is based on platinum.

4. The silicone composition as defined by claim 1, in which:
  the POS (I) is substantially linear and has a dynamic viscosity of less than or equal to 10,000 mPa·s;
  the POS (II) is substantially linear and has a dynamic viscosity of less than or equal to 200,000 mPa·s;
  the POS (III) has a dynamic viscosity of less than or equal to 150,000 mPa·s; and/or
  the POS (IV) is present and is substantially linear and has a dynamic viscosity of less than or equal to 50,000 mPa·s.

5. A system having at least two components (A1) and (B1) comprising the constituents (A), (B), (C) and (D) and optionally the constituent (E) of the silicone composition as defined by claim 1, with the condition that the hydrosilylation reaction catalyst (D) is separate from the constituent (B).

6. A crosslinked gel obtained by crosslinking the silicone composition as defined by claim 1.

7. A crosslinked gel obtained by crosslinking the system as defined by claim 5.

8. An adhesive, coating, leaktight mastic, encapsulated electronic device, implant, prosthesis, impact-cushioning element, cement or dressing comprising the crosslinked gel as defined by claim 6.

9. An adhesive, coating, leaktight mastic, encapsulated electronic device, implant, prosthesis, impact-cushioning element, cement or dressing comprising the crosslinked gel as defined by claim 7.

10. The silicone composition as defined by claim 1, wherein POS (II) and POS (III), the radicals X are vinyl radicals.

11. The silicone composition as defined by claim 1, said POS (III) having less than 1.5 mol % of siloxyl unit $T=jRS10_{3/2}$.

12. The silicone composition as defined by claim 1, said POS (III) having less than 1 mol % of siloxyl unit $T=RSiO_{3/2}$.

13. The silicone composition as defined by claim 4, said POS (I) having a dynamic viscosity of less than or equal to 6,000 mPa·s, said POS (II) having a dynamic viscosity of less than or equal to 170,000 mPa·s, said POS (III) having a dynamic viscosity ranging from 20 to 100,000 mPa·s and/or said POS (IV) having a dynamic viscosity ranging from 20 to 40,000 mPa·s.

14. The silicone composition as defined by claim 12, said POS (I) having a dynamic viscosity ranging from 5 to 5,000 mPa·s and said POS (II) having a dynamic viscosity ranging from 20 to 165,000 mPa·s.

15. A crosslinked adhesive gel obtained by crosslinking the silicone composition as defined by claim 1.

16. A crosslinked adhesive gel obtained by crosslinking the system as defined by claim 5.

17. A silicone composition consisting of:
  (A) at least one polyorganosiloxane POS (I) having:
    a) endgroup siloxyl units of type $M=(R)_2(H)SiO_{1/2}$ in which the R radicals, which may be identical or different, are each an optionally substituted linear or branched $C_1$-$C_6$ alkyl radical and/or a substituted or unsubstituted aryl radical, and
    b) identical or different siloxyl units of type $D=(R^1)_p (H)_g SiO_{2/2}$ in which the $R^1$ radicals have the same definition as R and p=1 or 2, g=0 or 1 and g+g=2;

with the proviso that the polyorganosiloxane POS (I) comprises at least two SiH radicals per molecule;

(B) at least one polyorganosiloxane POS (II) having:
  a) endgroup siloxyl units of type $M=(X)_s(R^2)_t SiO_{1/2}$ in which the $R^2$ radicals have the same definition as R, the X radicals are alkenyl radicals having from 2 to 6 carbon atoms, s=0 or 1, t=2 or 3 and s+t=3; and
  b) identical or different siloxyl units of type $D=(X)_u (R^3)_v SiO_{2/2}$ in which the $R^3$ radicals have the same definition as R, the X radicals are alkenyl radicals having from 2 to 6 carbon atoms, u=0 or 1, v=1 or 2 and u+v=2, with the proviso that the polyorganosiloxane POS (II) comprises at least two X radicals per molecule;

(C) at least one monofunctional polyorganosiloxane POS (III) which is essentially linear, having less than 2 mol % of siloxyl unit $T=RSiO_{3/2}$, and which comprises, per molecule, one alkenyl radical (X) having from 2 to 6 carbon atoms directly bonded to a silicon atom, the said POS (III) having:
  a) identical or different endgroup siloxyl units of type $M=(X)_w(R^4)_x SiO_{1/2}$ in which the $R^4$ radicals have the same definition as R, w=0, x=3; and
  b) at least one siloxyl unit $D=(X)_y(R^5)_z SiO_{2/2}$ in which the $R^5$ radicals have the same definition as R, y=1, z=1, (D) an effective amount of at least one hydrosilylation reaction catalyst; and (E) at least one nonfunctionalized polyorganosiloxane POS (IV) having:
  a) endgroup siloxyl units of type $M=(R^6)_3SiO_{1/2}$ in which the $R^6$ radicals have the same definition as R, and
  b) identical or different siloxyl units of type $D=(R^7)_2 SiO_{2/2}$ in which the $R^7$ radicals have the same definition as R;
with the proviso that the amount of the constituents (A), (B), (C) and (E) is such that the molar ratio r of the hydrogen atoms bonded to silicon to the alkenyl radicals (X) bonded to silicon ranges is 1:1;
wherein the composition is crosslinkable into a gel by hydrosilylation and said composition, upon crosslinking, has a viscous modulus, (G") and an elastic modulus (G') greater than a comparable composition lacking component (C), POS (III).

* * * * *